United States Patent
Weimer

(10) Patent No.: US 6,194,729 B1
(45) Date of Patent: Feb. 27, 2001

(54) PARTICLE BEAM APPARATUS

(75) Inventor: Eugen Weimer, Essingen (DE)

(73) Assignee: LEO Elektronenmikroskopie GmbH (DE)

( * ) Notice: Subject to any disclaimer, the term of this patent is extended or adjusted under 35 U.S.C. 154(b) by 0 days.

(21) Appl. No.: 09/123,017

(22) Filed: Jul. 26, 1998

(30) Foreign Application Priority Data

Jul. 25, 1997 (DE) ............................................. 197 32 093

(51) Int. Cl.$^7$ .............................. G01N 23/00; H01J 37/29
(52) U.S. Cl. .............................. 250/396 ML; 250/396 R; 250/310
(58) Field of Search .............................. 250/310, 396 R, 250/397, 396 ML

(56) References Cited

U.S. PATENT DOCUMENTS

| | | | |
|---|---|---|---|
| 3,896,331 | * 7/1975 | Enck et al. | 315/17 |
| 4,330,707 | * 5/1982 | Manzke | 250/310 |
| 4,713,543 | * 12/1987 | Feuerbaum et al. | 250/398 |
| 4,785,176 | * 11/1988 | Frosien et al. | 250/396 R |
| 5,146,090 | * 9/1992 | Plies | 250/396 ML |
| 5,389,787 | 2/1995 | Todokoro et al. | 250/310 |
| 5,412,209 | * 5/1995 | Otaka et al. | 250/310 |
| 5,424,541 | * 6/1995 | Todokoro et al. | 250/310 |
| 5,502,306 | * 3/1996 | Meisburger et al. | 250/310 |
| 5,872,358 | * 2/1999 | Todokoro et al. | 250/397 |

FOREIGN PATENT DOCUMENTS

| | | | |
|---|---|---|---|
| 29 22 325 C2 | 9/1991 | (DE) | H01J/37/28 |
| 0 180 723 B1 | 8/1985 | (EP) | H01J/37/04 |
| 0 769 799 A2 | 10/1996 | (EP) | H01J/37/28 |

OTHER PUBLICATIONS

Polasko et al. Low Energy Electron Beam Lithography. Optical Engineering. Mar., Apr. 1983. vol. 22 No. 2. pp. 195–198.

* cited by examiner

*Primary Examiner*—Bruce C. Anderson

(57) ABSTRACT

The invention relates to a particle beam apparatus, in which very low target energies of the particles focused on the object can be set, with good imaging conditions. For this purpose, the beam guiding tube (5), from the anode (4) to behind the objective (6, 7) is at a high potential, which insures that the particles within the beam guiding tube have a high kinetic energy which is independent of the target energy. A braking electrode (9) arranged after the beam guiding tube, together with the object holder (10) and the object arranged thereon, is at a specimen potential $U_P$ which deviates from the ground potential and which has the same sign as the cathode potential $U_K$. The specimen potential $U_P$ acts as the decelerating potential, by means of which the particles are braked to energies which can be below the energy value determined by the cathode potential $U_K$. Thus even at the lowest target energies the object does not need to be brought to a high, high-voltage potential, so that object damage and high voltage flashovers are excluded. At the same time, the kinetic energy of the electrons within the beam guiding tube is largely independent of the target energy, so that the imaging relationships within the beam guiding tube are largely independent of the target energy.

24 Claims, 2 Drawing Sheets

PARTICLE BEAM APPARATUS

Background of the Invention

1. Field of the Invention

The invention relates to a particle beam apparatus in which an object is irradiated with a focused beam of electrically charged particles, such as electrons, positrons, or ions, and more particularly to such a particle beam apparatus in which the particle energy can be set at values below 1 keV. Such apparatuses are used in the form of scanning electron microscopes, particularly for inspection of semiconductor wafers and also for imaging and analysis of objects with low conductivity. In order to avoid charging of the specimen surface, or for analysis of regions near the surface, the energy when incident on the object should not exceed certain limiting energies which lie between 10 eV and 5keV.

2. Discussion of Relevant Art

Since the chromatic imaging errors of the electrostatic or magnetic lenses used for focusing the particle beam are inversely proportional to the particle energy, the resolution defined by the focal diameter of the particle beam is substantially worse at low particle energies than at higher particle energies. To solve this problem, it is known to first accelerate the particles to a substantially higher energy than the desired target energy when incident on the object and to reduce the particle energy by means of a decelerating device shortly before incidence on the object. Such a decelerating device usually consists of two or more electrodes to which an electrostatic decelerating field is applied. Braking of the particles can take place either in the rear portion of the objective or after leaving the objective, between the objective and the object.

Such heretofore known solutions can be divided into two groups.

In the first group of devices, the beam guiding tube is at ground potential from the anode at least as far as to the pole piece gap of the objective, and the object is at a the anode at least as far as to the pole piece gap of the objective, and the object is at a high voltage potential, which has the same sign as the cathode potential. Such arrangements are described in the article by KJ. Plasko et al., "Low energy electron beam lithography",in Optical Engineering, March/April 1983, pages 195ff., in U.S. Pat. 5,389,787, and in European Patent EP-A2 0 769 799. At low target energies, particularly at target energies below 1 keV and an energy of the particles within the beam guiding tube of 10–20 keV, the specimen has to be placed at a correspondingly high potential of 9-19 kV. Besides insulation problems that arise at the specimen table, voltage flashovers between the object and the objective, or damage to the object due to internal currents arising from switching on and off the high voltage, can easily arise here. Detection of the secondary electrons emitted by the object is also very difficult, since these secondary electrons have to be extracted and accelerated again without affecting the primary beam.

In the second variant, the object and the electrode of the decelerating device on the object side are at ground potential, and the beam guiding tube from the anode as far as to the first electrode of the decelerating device is at a high anode potential, the sign of which is chosen such that a deceleration of the particles takes place when they leave the beam control tube. Such systems are described, for example, in German Patent DE 29 22 325 C2 and in European Patent EP 0 180 723 B1. With the arrangement according to German Patent DE 29 22 325 C2, the setting of the target energy takes place by variation of the potential of the beam guiding tube. A fixed but opposite potential between the cathode and the anode is superimposed on this variable anode potential. At target energies between 0.5 and 1 keV, the whole beam guiding tube from the anode to the objective is at a potential that is only 0.5–1 keV smaller in absolute value than the potential difference between cathode and anode. Since insulation from the surroundings has to be correspondingly set up, this arrangement can only be used at low maximum energies. For target energies below 0.2 keV, the emission becomes increasingly unstable with decreasing target energy, since the cathode potential nearly corresponds to the ground potential and therefore any stray field can affect the emission. This arrangement is therefore of little use for target energies below 0.2 keV.

In an arrangement according to European Patent EP 0 180 723 B 1, it is known from the apparatus LEO 1500 of LEO Elektronenmikroskopie GmbH, 73446 Oberkochen, Germany to keep the potential of the anode and of the beam guiding tube constant, independently of the target energy, as far as the braking device, and to vary the cathode potential in order to vary the target energy. This leads to the disadvantage that when there is a change of the target energy the energy of the particles within the beam guiding tube also changes. Consequently all the parameters within the imaging system, particularly the strength of the magnetic lenses, have to be correspondingly matched. This is especially critical at low energies, and thus low energies in the beam guiding tube, since small errors in settings already have large effects. Therefore the low energy region, particularly the region of target energies below 2 kV, has to be correspondingly finely equalized. Also, in this device, the cathode potential corresponds to the target energy, as against the ground potential, so that in this arrangement also, the emission is unstable at target energies below 0.2 keV.

SUMMARY OF THE INVENTION

The object of the invention is to provide an arrangement with which, even at the lowest target energies, which can be below 0.2 keV, a stable and constant operation can be achieved, without the object having to be placed at a high potential level compared to the ground potential. In addition, good detectability of secondary or back-scattered particles arising from the interaction of the particles with the object can be realized, even at small distances between the objective and the object.

This object is achieved by a particle beam apparatus with a particle beam generator including a cathode and an anode for acceleration to anode potential of the particles coming from the cathode, a beam guiding tube, an objective for focusing the particle beam onto an object, and a decelerating device. The anode and the beam guiding tube are at the same high voltage potential, which is high with respect to ground potential, and the decelerating device and the object are at the same potential, which deviates from ground potential at low target energies and is opposite to the anode potential.

The particle beam apparatus of the invention has a substantially known construction that consists of a particle generator or source with a cathode and an anode for emission and acceleration of the particles, a beam guiding tube, at least one objective for focusing the particle beam on an object, and a decelerating device. The anode and the beam guiding tube lie at the same high voltage potential, which is high with respect to the ground potential. At the same time, the last electrode of the decelerating device and the specimen lie at a common potential, which at least for the lowest target energies deviates from the ground potential and has a sign opposite that of the anode potential.

The invention thus departs from the prior art forms of construction in which at least either the beam guiding tube or the object is kept at ground potential. Instead, the known solutions are combined together such that the specific advantages of the known solutions are attained without the specific disadvantages of the individual solutions having to be taken into account. With application of a moderate high voltage potential below 5 kV to the object, no great problems now arise as regards insulation or object damage. Simultaneously even at the lowest target energies the cathode potential with respect to ground potential can be kept to a value of 0.2–5 kV, at which the emission is stable. And at high target energies, the energy setting is reached by appropriate raising of the cathode potential, with the object preferably being at ground potential.

The cathode potential is greater than 0.2 kV, preferably greater than 0.5 kV, at all target energies. The sign of the cathode potential is chosen in dependence on the sign of the particle charges so that the particles at cathode potential have a higher potential energy with respect to ground potential. At the same time, the anode potential is greater than 5 kV in absolute value, and its sign is chosen so that the particles at anode potential have a smaller potential energy than the ground potential. The particles leaving the cathode are thus accelerated to an energy that corresponds to the potential difference between the cathode and anode and should amount to at least 5–10 kV. The particles pass through the beam guiding tube with this energy, at which the chromatic errors of the imaging elements are still kept within tolerable limits, and are braked to the target energy after leaving the beam guiding tube.

The setting of the target energy takes place by setting the potential at the object and at the decelerating device with respect to the ground potential. For target energies between zero and the particle energy at the cathode potential, the energy within the beam guiding tube thus remains constant. Thus a fine equalization of the particle optics column is not required. This considerably simplifies the operation of the system and, in particular with the additional use of correcting elements (e.g., of multipolar correctors), represents a substantial advantage for the reduction of the aberrations of the lenses. The value of the specimen potential required for setting the target energy is at most as large in absolute value as the cathode potential and has a maximum value amounting to 5 kV. As a result, voltage flashovers, insulation problems, and/or sample damage when the specimen potential is switched on and off do not occur.

Setting higher target energies takes place in the particle beam apparatus according to the invention by an increase in the absolute value of the cathode potential. The anode potential remains constant, so that good detection of secondary or back-scattered electrons is always insured.

In the particle beam apparatus according to the invention, in the operation of the apparatus at the lowest target energies, particularly at target energies below 0.5 keV, the specimen and the decelerating device are thus at a potential which has the same sign as the cathode potential. In contrast, the anode potential has an opposite sign.

For setting different potentials in the particle beam apparatus according to the invention, three adjustable high voltage sources are provided, respectively for the potentials of the decelerating device, the anode, and the cathode. Setting the optimum potentials can take place by a control in dependence on the values for the target energy and the maximum permissible specimen potential, and from parameters that are input by the user.

In an advantageous embodiment, the beam guiding tube has a widened region in a region between the particle beam generator and the objective. In this region a detector is at the potential of the beam guiding tube and is arranged for detecting the secondary electrons leaving the object. The secondary or back-scattered electrons leaving the object are accelerated by the decelerating device in a reverse direction to that of the primary beam to the difference between the potential of the specimen and the potential of the beam guiding tube, and have enough energy to be easily detectable.

The particle beam apparatus according to the invention can be constructed with only one objective as the single imaging element, or as an at least two-lens system of objective and condenser. A two-lens system of condenser and objective advantageously finds application in combination with a source from which the particles emerge relatively undirected, since the usable aperture of the particles leaving the cathode in two-stage systems is greater than in one-stage systems. With a weaker excitation of the condenser, the aperture of the particle beam on the objective side is reduced and can thus be optimally matched to the requirements. The stochastic interactions that arise between the particles in two-stage imaging systems with an intermediate imaging of the source lead, however, to a spreading of the energy and thus to excessively large energy-dependent imaging errors. Thus, a single-stage imaging system consisting of only one objective is preferred in the case of sources that emit in a strongly directed manner.

In the particle beam apparatus according to the invention, the decelerating device can be constructed by means of the rear end of the beam guiding tube and one or more further electrodes. For this purpose, the rear end of the beam guiding tube is advantageously constructed as a tubular electrode. The further electrode of the decelerating device is preferably received on an insulating body of the objective.

The objective can be basically constructed as a magnetic objective or as an electrostatic single lens.

BRIEF DESCRIPTION OF THE DRAWINGS

Details of preferred embodiments of the invention will now be described in greater detail in the example of scanning electron microscopes, taken together with the accompanying drawings, in which.

DETAILED DESCRIPTION OF PREFERRED EMBODIMENTS

Figure 1:
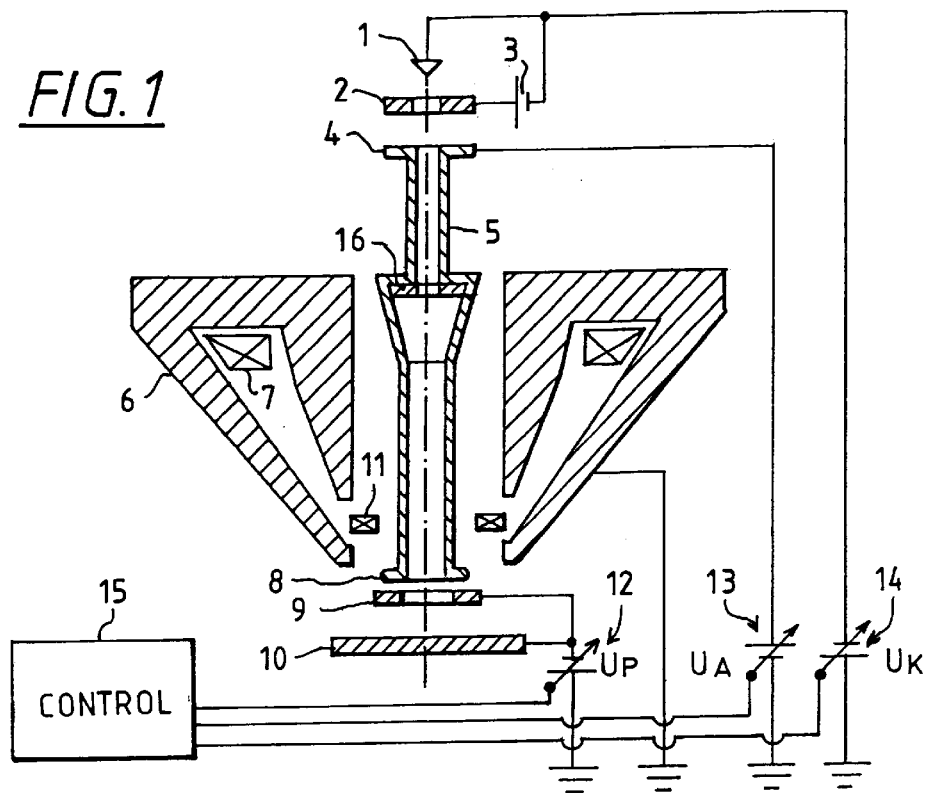
FIG. 1 shows a schematic diagram of a first embodiment of a particle beam apparatus according to the invention, in section.

The particle beam generator in the particle beam apparatus according to the invention consists of a cathode (1) that emits the particles, an extraction electrode (2), and an anode (4). If the particle beam apparatus according to the invention is constructed as a scanning electron microscope, the cathode is preferably a thermionic field emitter. According to the construction of the cathode (1), the extraction electrode (2) is at a potential of 2–5 kV with respect to the cathode (1), so that the particles are extracted from the cathode (1) by the extraction electrode (2). A first adjustable high voltage source (14) is provided for production of the cathode potential $U_K$, and a fixed voltage source (3) is provided for production of the fixed potential difference between the cathode (1) and the extraction electrode (2).

The anode (4) simultaneously constitutes the source-side end of the beam guiding tube (5). This beam guiding tube (5) of electrically conductive material passes through the pole piece (6) of a magnetic lens, which acts as the objective. The beam guiding tube (5) is made thickened at the end (8) toward the object, as a tubular lens. This thickened object-side end of the beam guiding tube (5) ends only just behind the pole piece gap of the magnetic lens, the coils of which are denoted by (7). A single electrode (9) is arranged after the beam guiding tube, and in common with the tubular electrode (8) of the beam guiding tube (5) forms an electrostatic decelerating device. In common with the whole beam guiding tube (5), the tubular electrode (8) is at the anode potential $U_A$, which is produced by a second adjustable high voltage source (13). The single electrode (9) and the object table (10) are at a common potential $U_P$, which is produced by a third adjustable high voltage source (12). The tubular electrode (8) and the single electrode (9) simultaneously act as an electrostatic lens, (immersion lens) by means of which the particle beam is focused on the object, additionally to the action of the objective.

In the operation of the particle beam apparatus, the particles leaving the cathode are accelerated until reaching the anode up to an energy corresponding to the potential difference between the cathode (1) and the anode (4), and then pass through the beam guiding tube (5) with this constant energy. After leaving the beam guiding tube between the tubular electrode (8) and the single electrode (9), the particles are then decelerated to a target energy which corresponds to the potential difference between the cathode potential $U_K$ and the specimen potential $U_P$. The setting of this target energy takes place, at low target energies, by means of a change of the specimen potential $U_P$, with a respectively fixed anode potential $U_A$ and cathode potential $U_K$. Here low energies are energies which are smaller in absolute value than the particle energy at cathode potential. At higher target energies, the specimen potential $U_P$ is zero and maintaining the particle energy constant within the beam guiding tube takes place by mutually matched changing of the cathode potential $U_K$ and of the anode potential $U_A$.

Examples of potential combinations for reference energies within the beam guiding tube of 10 or 15 keV in the case of electrons are given in Tables 1 and 2. Other associated potential values can easily be supplemented for optional target energies between the given values. For target energies between 0 keV and the reference energy in the beam guiding tube, the energy $U_S$ in the beam guiding tube can be kept constant in the particle beam apparatus according to the invention. A control (15) can be provided for setting the suitable potential combinations, and selects the suitable combinations of potentials as a function of the target energy, the reference energy in the beam guiding tube, and the maximum permissible specimen potential $U_P$, as parameters which can be provided in advance by the user.

TABLE 1

| Target energy keV | $U_K$, kV | $U_A$, kV | $U_P$, kV | $U_S$, keV |
|---|---|---|---|---|
| 0 | −2 | 8 | −2 | 10 |
| 0.5 | −2 | 8 | −1.5 | 10 |
| 1 | −2 | 8 | −1 | 10 |
| 2 | −2 | 8 | 0 | 10 |
| 3 | −3 | 8 | 0 | 11 |
| 5 | −5 | 8 | 0 | 13 |
| 10 | −10 | 8 | 0 | 18 |
| 15 | 15 | 8 | 0 | 23 |
| 20 | 20 | 8 | 0 | 28 |
| 30 | 30 | 8 | 0 | 38 |

TABLE 2

| Target energy keV | $U_K$, kV | $U_A$, kV | $U_P$, kV | $U_S$, keV |
|---|---|---|---|---|
| 0 | −2 | 13 | −2 | 15 |
| 0.5 | −2 | 13 | −1.5 | 15 |
| 1 | −2 | 13 | −1 | 15 |
| 2 | −2 | 13 | 0 | 15 |
| 3 | −3 | 13 | 0 | 16 |
| 5 | −5 | 13 | 0 | 18 |
| 10 | −10 | 13 | 0 | 23 |
| 15 | −15 | 13 | 0 | 28 |
| 20 | −20 | 13 | 0 | 33 |
| 30 | −30 | 13 | 0 | 43 |

A deflection system (11) is provided for scanning a larger object region, and is arranged outside the beam guiding tube at the height of the pole piece gap. By the arrenment of the deflecting system (11) at the height of the pole piece gap, deflection for the scanning of objects takes place in the main plane of the objective.

The beam guiding tube is widened in the source-side region between the particle beam generator and the objective, or in the source-side region of the objective. Annular detector (16) for secondary or back-scattered electrons is arranged, concentric to the optical axis, in this widened region. Electrons leaving the object are accelerated to the difference potential $U_A-U_K$ by the deceleration field between single electrode (9) and the tubular electrode (8), in the reverse direction to the primary beam, and thus have sufficient energy to be detectable by means of a semiconductor detector or a scintillation detector. There is no compelling reason for the emission of the electrons from the object to be stimulated by a primary electron beam. On the contrary it is also possible that the stimulation takes place by means of UV light or gamma radiation, for which purpose the apparatus then has additional UV light sources and/or gamma ray sources.

Figure 2:
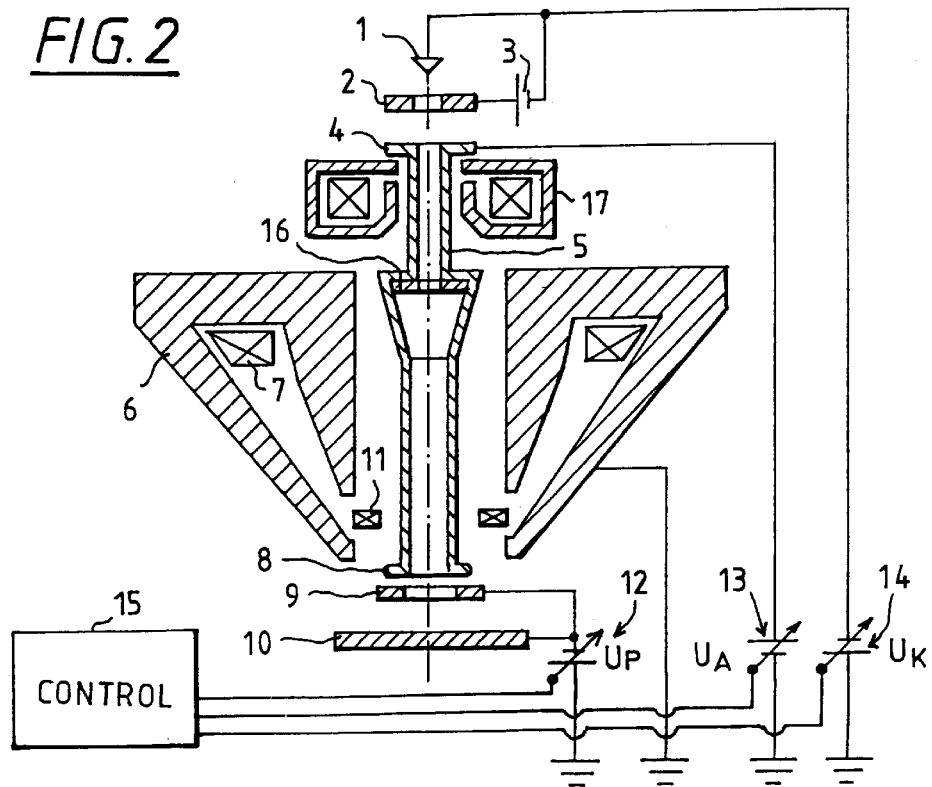
FIG. 2 shows a schematic diagram of a second embodiment of a particle beam apparatus according to the invention, in section.

In the embodiment in FIG. 2, components identical to the components in the embodiment of FIG. 1 are given the identical reference symbols. The difference between the two embodiments is that a condenser (17) is provided as an additional imaging stage between the anode (4) and the objective (6, 7). The condenser (17) provides a real intermediate image of the emitting surface of the cathode (1), which surface is then imaged by the objective (6,7) onto the object. In such a two-stage imaging system, in contrast to the single-stage imaging system in FIG. 1, the yield of the particles emitted by the cathode and focused on the object is somewhat greater. For them, stochastic interactions between the particles take place in the intermediate image of the cathode (1), and thus in the so-called crossover, so that the chromatic aberrations of the whole imaging system are increased.

Figure 3:
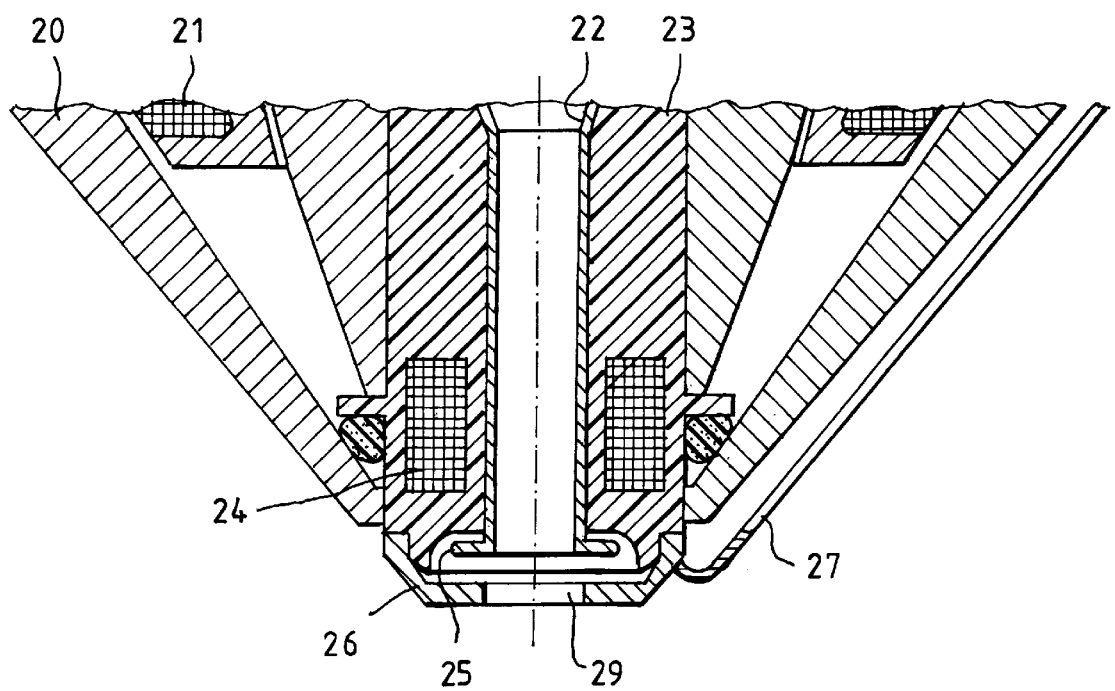
FIG. 3 shows a detail illustration of the lower part of the objective, in a particle beam apparatus according to the invention, in section.

In the detail representation in FIG. 3 of the region of the objective on the object side, the pole pieces of the objective are referenced (20) and the objective coils with (21). The beam guiding tube (22) is received in a bore of the objective pole piece (20) via an annular insulator (23) that surrounds the beam guiding tube (22). The deflecting system (24) is arranged at the level of the pole piece gap of the pole piece (20). The object side end of the beam guiding tube (22) furthermore has an annular widening, so that the end of the beam guiding tube (22) on the object side end acts as a tubular electrode. The second electrode (26), which in common with the tubular electrode (25) of the beam guiding tube (22) forms the braking device, is furthermore received on the insulator (23). Thus the beam guiding tube (22) is continued to the extent that the tubular electrode (25) is arranged, in the direction of the primary electron beam, behind the pole piece gap in a region in which the magnetic field coming out from the pole piece gap has nearly completely decayed. Braking of the particles to the target energy then takes place directly in front of the object, so that interfering effects due to external electrical or magnetic fields are reduced.

The braking electrode (26) is constructed as a central, flattened conical ring with a middle bore (29). The middle bore (29) is arranged centered on the core of the pole piece (20) and on the beam guiding tube (22). Collisions between the electrode (26) and the object when the object tilts are thus avoided.

The potential supply of the braking electrode (26) takes place via a lead (27) on the outer surface of the objective pole piece (20).

It should be noted at this point that the braking of the particles does not absolutely have to take place behind the objective, even if this is preferred since thereby the particles are kept for as long as possible at high kinetic energy.

An arrangement of the braking device inside the objective is also conceivable, as in European Patent EP 0 180 723 B1 cited at the beginning.

The invention has been explained by means of the embodiments shown in the Figures, for the case in which the particles are electrons. In the use of the invention for positively charged particles, it is only necessary to invert the polarity of the cathode potential, anode potential, and specimen potential, i.e., to replace a positive potential by a negative potential, and a negative potential by a positive potential.

Furthermore, it is not obligatory for the objective to be a magnetic lens. It is also possible to use an electrostatic lens for focusing the particles; this is particularly advantageous in the use of heavy particles such as ions. Such an electrostatic single lens can be constructed in a known manner from three successive electrodes, the two outer electrodes of which are at the potential of the beam guiding tube, while the middle electrode is at a potential which corresponds in polarity to the cathode potential, but is considerably smaller. The beam guiding tube can have a square, widened region, in which the middle electrode is arranged, to receive such an electrostatic lens. The two edge electrodes are formed by the square surfaces that stand at right angles to the tube axis. Such a single lens leads to no change of the particle energy, in contrast to the electrostatic immersion lens.

I claim:

1. A particle beam apparatus comprising:
    a particle beam generator including
        a cathode, and an anode for acceleration to anode potential of particles coming from said cathode,
    an objective for focusing said particle beam onto an object, and
    a decelerating device,
    in which said anode and said beam guiding tube are at a same high voltage potential, which is high with respect to ground potential, and said decelerating device and said object are at a same potential, which deviates from ground potential at low target energies and is of opposite polarity to said anode potential.

2. The particle beam apparatus according to claim 1, in which a cathode potential $U_K$ is always greater in absolute value than 0.2 kV, and the sign of said cathode potential is chosen in dependence on the sign of charges of said particles such that said particles have a higher potential energy relative to ground potential, and said anode potential $U_A$ is chosen as regards sign such that said particles at said anode potential have a smaller potential energy relative to ground potential.

3. The particle beam apparatus according to claim 1, in which said potential of said decelerating device $U_P$ can be varied in order to change target energy of particles at said object with respect to ground potential.

4. The particle beam apparatus according to claim 1, in which a specimen and said decelerating device, at low target energies of particles, are at a potential which has the same sign as a cathode potential $U_K$ with respect to ground potential.

5. The particle beam apparatus according to claim 1, in which a specimen potential $U_P$ can be set between the value of ground potential and the value of said cathode potential, as limiting values.

6. The particle beam apparatus according to claim 1, in which said beam guiding tube is widened out in a region between said beam generator and said objective lens, and a detector detects secondary or back-scattered electrons, arranged in the widened region between said beam generator and the objective lens.

7. The particle beam apparatus according to claim 1, in which said decelerating device comprises a single electrode that cooperates with an object-side end of said beam guiding tube.

8. The particle beam apparatus according to claim 7, in which said beam guiding tube is formed as a tubular electrode at said object-side end, and said single electrode is received on an insulating body on said objective.

9. A particle beam apparatus comprising:
    a particle beam generator including a cathode, and an anode for acceleration to anode potential of particles coming from said cathode,
    a beam guiding tube,
    an objective for focusing said particle beam onto an object,
    a decelerating device, and
    three adjustable high voltage sources for potentials of said decelerating device, said anode, and said cathode,
    in which said anode and said beam guiding tube are at a same high voltage potential, which is high with respect to ground potential, and said decelerating device and said object are at a same potential, which deviates from ground potential at low target energies and is of opposite polarity to said anode potential.

10. The particle beam apparatus according to claim 9, in which a cathode potential $U_K$ is always greater in absolute value than 0.2 kV, and the sign of said cathode potential is chosen in dependence on the sign of charges of said particles such that said particles have a higher potential energy relative to ground potential, and said anode potential $U_A$ is chosen as regards sign such that said particles at said anode potential have a smaller potential energy relative to ground potential.

11. The particle beam apparatus according to claim 9, in which said potential of said decelerating device $U_P$ can be varied in order to change target energy of particles at said object with respect to ground potential.

12. The particle beam apparatus according to claim 9, in which a specimen and said decelerating device, at low target energies of particles, are at a potential which has the same sign as a cathode potential $U_K$ with respect to ground potential.

13. The particle beam apparatus according to claim 9, in which a specimen potential $U_P$ can be set between the value of ground potential and the value of said cathode potential, as limiting values.

14. The particle beam apparatus according to claim 9, in which said beam guiding tube is widened out in a region between said beam generator and said objective lens, and a detector detects secondary or back-scattered electrons, arranged in the widened region between said beam generator and the objective lens.

15. The particle beam apparatus according to claim 9, in which said decelerating device comprises a single electrode that cooperates with an object-side end of said beam guiding tube.

16. The particle beam apparatus according to claim 9, in which said beam guiding tube is formed as a tubular electrode at said object-side end, and said single electrode is received on an insulating body on said objective.

17. A particle beam apparatus comprising:
a particle beam generator including a cathode, and an anode for acceleration to anode potential of particles coming from said cathode,
a beam guiding tube,
an objective for focusing said particle beam onto an object, and
a decelerating device,
in which said anode and said beam guiding tube are at a same high voltage potential, which is high with respect to ground potential, and
further comprising an adjustable high voltage source connected to said decelerating device and said object so that said decelerating device and said object are at the same potential, deviating from ground potential at low target energies and being of opposite polarity to said anode potential, whereby at low target energies adjustment of the target energy is achieved by changing the potential of said decelerating device and said object.

18. The particle beam apparatus according to claim 17, in which a cathode potential $U_K$ is always greater in absolute value than 0.2 kV, and the sign of said cathode potential is chosen in dependence on the sign of charges of said particles such that said particles have a higher potential energy relative to ground potential, and said anode potential $U_A$ is chosen as regards sign such that said particles at said anode potential have a smaller potential energy relative to ground potential.

19. The particle beam apparatus according to claim 17, in which a specimen and said decelerating device, at low target energies of particles, are at a potential which has the same sign as a cathode potential $U_K$ with respect to ground potential.

20. The particle beam apparatus according to claim 17, further comprising three adjustable high voltage sources for potentials of said decelerating device, said anode, and said cathode.

21. The particle beam apparatus according to claim 17, in which a specimen potential $U_P$ can be set between the value of ground potential and the value of said cathode potential, as limiting values.

22. The particle beam apparatus according to claim 17, in which said beam guiding tube is widened out in a region between said beam generator and said objective lens, and a detector detects secondary or back-scattered electrons, arranged in the widened region between said beam generator and the objective lens.

23. The particle beam apparatus according to claim 17, in which said decelerating device comprises a single electrode that cooperates with an object-side end of said beam guiding tube.

24. The particle beam apparatus according to claim 17, in which said beam guiding tube is formed as a tubular electrode at said object-side end, and said single electrode is received on an insulating body on said objective.

* * * * *